United States Patent
Thangavelu et al.

(10) Patent No.: US 11,686,757 B2
(45) Date of Patent: Jun. 27, 2023

(54) SYSTEMS AND METHODS FOR CIRCUIT FAILURE PROTECTION

(71) Applicant: Hamilton Sundstrand Corporation, Charlotte, NC (US)

(72) Inventors: Kamaraj Thangavelu, Rockford, IL (US); Matthew Ryan Hasseman, Poplar Grove, IL (US); Jeffrey D. Myroth, Roscoe, IL (US); Ryan Thomas Carter, Woodstock, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 93 days.

(21) Appl. No.: 17/475,227

(22) Filed: Sep. 14, 2021

(65) Prior Publication Data

US 2023/0083816 A1    Mar. 16, 2023

(51) Int. Cl.
| | |
|---|---|
| *G01R 31/00* | (2006.01) |
| *G01R 31/28* | (2006.01) |
| *G01R 31/50* | (2020.01) |
| *G01R 31/30* | (2006.01) |
| *G06F 11/30* | (2006.01) |
| *G06F 11/22* | (2006.01) |

(52) U.S. Cl.
CPC ....... *G01R 31/008* (2013.01); *G01R 31/2815* (2013.01); *G01R 31/2834* (2013.01); *G01R 31/3004* (2013.01); *G01R 31/50* (2020.01); *G06F 11/2284* (2013.01); *G06F 11/3062* (2013.01); *G01R 31/2827* (2013.01)

(58) Field of Classification Search
CPC .............. G01R 31/008; G01R 31/2815; G01R 31/2834; G01R 31/3004; G01R 31/50; G01R 31/2827; G06F 11/2284; G06F 11/3062

See application file for complete search history.

(56) References Cited

U.S. PATENT DOCUMENTS

| | | |
|---|---|---|
| 8,169,921 B2 | 5/2012 | Yang et al. |
| 8,779,706 B2 | 7/2014 | Tsuji |
| 8,963,590 B2 | 2/2015 | Guimont et al. |
| 9,430,007 B2 | 8/2016 | Jacobson et al. |
| 10,374,426 B2 | 8/2019 | Krenz et al. |
| 10,931,178 B2 * | 2/2021 | Hjertvikrem ...... H02K 11/0094 |
| 2007/0259545 A1 * | 11/2007 | Berenger ................. H02J 1/10 439/135 |
| 2020/0370777 A1 | 11/2020 | Kabler et al. |

FOREIGN PATENT DOCUMENTS

CN        108982255 B        4/2020

* cited by examiner

*Primary Examiner* — Alvaro E Fortich
*Assistant Examiner* — Dilara Sultana
(74) *Attorney, Agent, or Firm* — Locke Lord LLP; Daniel J. Fiorello; Gabrielle L. Gelozin

(57) ABSTRACT

In accordance with at least one aspect of this disclosure, a controller for an aircraft electrical system includes, a software safe module. In embodiments, the software safe module can be configured to determine whether there was a sudden power failure upon controller initialization, and cause operation of the controller in a software safe mode if there was a sudden power failure such that manual intervention is required to leave the software safe mode to prevent repetitive power failure of the controller.

20 Claims, 3 Drawing Sheets

SYSTEMS AND METHODS FOR CIRCUIT FAILURE PROTECTION

TECHNICAL FIELD

This disclosure relates generally to circuit failure protection systems and methods (e.g., for avionics).

BACKGROUND

A typical aircraft control system can consist of multiple integrated circuits receiving input from a device and outputting control signals to different component of the device in order to control the device. The device could be any one or all of a generator control unit, bus power control unit, power distribution unit, or a motor control unit, for example. However, there may be instances in which the aircraft control system experiences intermittent power cycling and recovering automatically multiple times in the same flight cycle. Power cycling multiple times within same flight cycle can result in unpredictable system behavior and downstream effects such as bus cycling, contactor cycling, load failures and flight diversions.

Such conventional systems have been considered satisfactory for their intended purpose. However, there is a need in the art for improved circuit failure protection. This disclosure provides a solution for this need.

SUMMARY

In accordance with at least one aspect of this disclosure, a controller for an aircraft electrical system includes, a software safe module. In embodiments, the software safe module can be configured to determine whether there was a sudden power failure upon controller initialization, and cause operation of the controller in a software safe mode if there was a sudden power failure such that manual intervention is required to leave the software safe mode to prevent repetitive power failure of the controller.

In embodiments, the controller can include a data flag writing module configured to write a normal operation data flag that indicates normal operation to a memory of the software safe module in a normal operation mode. In embodiments, the controller can include a data flag clearing module configured to clear the normal operation data flag during a normal shutdown and wherein the controller is not otherwise configured to clear the normal operation data flag such that the normal operation data flag is indicative of a sudden power failure if it is present at controller initialization.

In embodiments, in determining whether there was a sudden power failure, the software safe module can be configured to check the memory for the normal operation data flag indicative of a sudden power failure upon initialization and before allowing operating the controller in the normal operational mode.

In certain such embodiments, the data flag writing module can be configured to write the normal operation data flag to the memory when an aircraft engine speed rises above a first threshold speed indicative of aircraft operation or other normal mode indicator is present, and the data flag clearing module is configured to clear the normal operation data flag when the aircraft engine falls below a second threshold speed indicative of aircraft shutdown or other normal shutdown indicator is present. In certain embodiments, the data flag module can be or include any suitable data configured to directly indicate or to inferentially indicate that the power to the controller was lost.

In embodiments, the software safe module can be configured to operate the controller in the software safe mode on a subsequent initialization if the data flag indicative of a sudden power failure continues to be stored in the memory at the subsequent initialization of the controller.

In accordance with another aspect of this disclosure, a computer implemented method can include, detecting whether a controller power is within limits, initializing a controller if the controller power is within limits, checking for a data flag indicative of a sudden power failure in a memory, and booting the controller in a software safe mode to prevent repetitive power failure if a data flag indicative of a sudden power failure is detected in the memory, wherein the software safe mode cannot be exited without manual intervention.

In embodiments, the method can further include booting the controller in a normal mode if the data flag indicative of a sudden power failure is not detected and writing a normal mode data flag indicative of the normal mode to a memory of the controller when the controller is booted in normal mode. In certain embodiments, the normal mode data flag indicative of normal operation mode is the data flag indicative of a sudden power failure if it is stored the memory at a subsequent initializing of the controller.

In embodiments, the method can further include clearing the data flag from the memory if a manual intervention signal is provided to the controller to prevent the controller from booting into software safe mode on the subsequent initialization.

In certain embodiments, booting the controller into the software safe mode can include one or more of: coordinating the software safe mode of the controller with one or more existing safe modes of the controller, placing all discrete elements of the controller into a safe state, relinquishing control of one or more dual controlled contactors of the controller, disabling one or more voltage regulators, disabling all controller communications outside of the electrical system; and/or maintaining an existing communication network within the controller.

In certain embodiments, the method can further include monitoring a control switch transition block for manual intervention, wherein manual intervention includes activating the control switch transition block. In certain such embodiments, the manual intervention includes a pilot activating the control switch transition block.

In certain embodiments, the method can include performing a health test of the controller if a data flag indicative of a sudden power failure is not detected and prior to booting in normal mode, and booting the controller into a normal mode if the controller passes the health test.

In accordance with yet another aspect of this disclosure, a non-transitory computer readable medium comprising computer executable instructions can be configured to cause a computer to execute a method. In embodiments, the method can include, detecting whether a controller power is within limits, initializing a controller if the controller power is within limits, checking for a data flag indicative of a sudden power failure in a memory, and booting the controller in a software safe mode to prevent repetitive power failure if a data flag indicative of a sudden power failure is detected in the memory, wherein the software safe mode cannot be exited without manual intervention.

In embodiments, the method can further include, booting the controller in a normal mode if the data flag indicative of a sudden power failure is not detected, and writing a normal mode data flag indicative of the normal mode to a memory of the controller when the controller is booted in normal mode. In embodiments, the normal mode data flag is the data flag indicative of a sudden power failure if it is stored in the memory at a subsequent initializing of the controller.

In embodiments, checking for the data flag can include checking the memory for the normal operation data flag indicative of a sudden power failure upon initialization and before allowing operating the controller in the normal operational mode. In embodiments, the method can further include clearing the data flag from the memory if a manual intervention signal is provided to the controller to prevent the controller from booting into software safe mode on the subsequent initialization.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
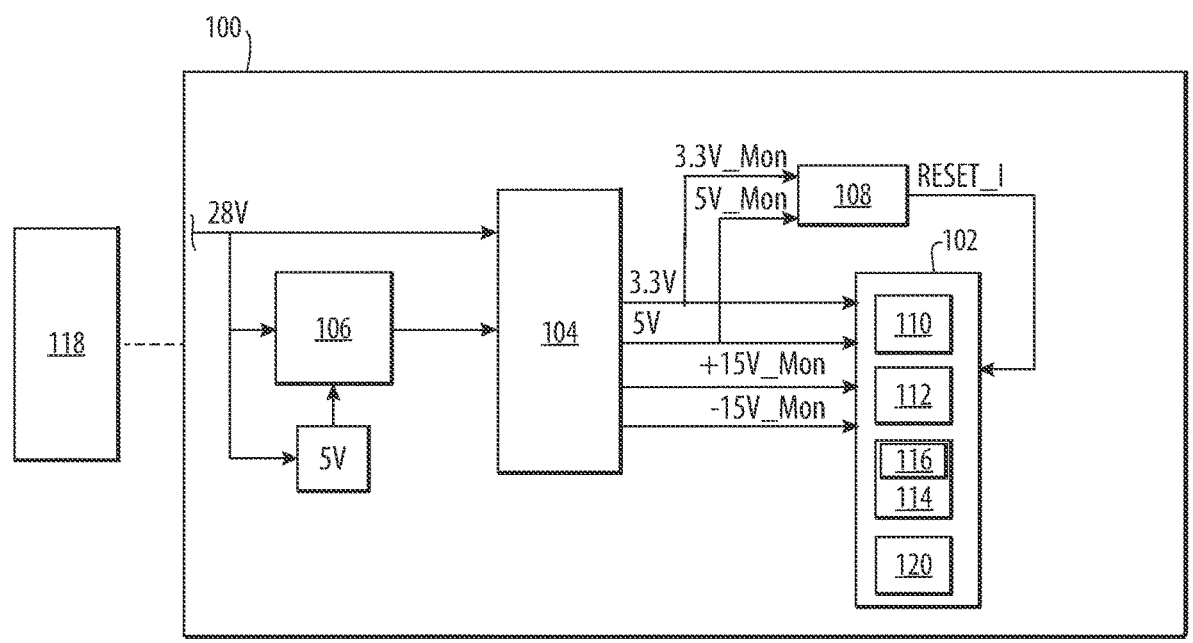
FIG. 1 is a schematic plan view of an electrical system constructed in accordance with this disclosure, showing electrical system components therein.
Figure 2:
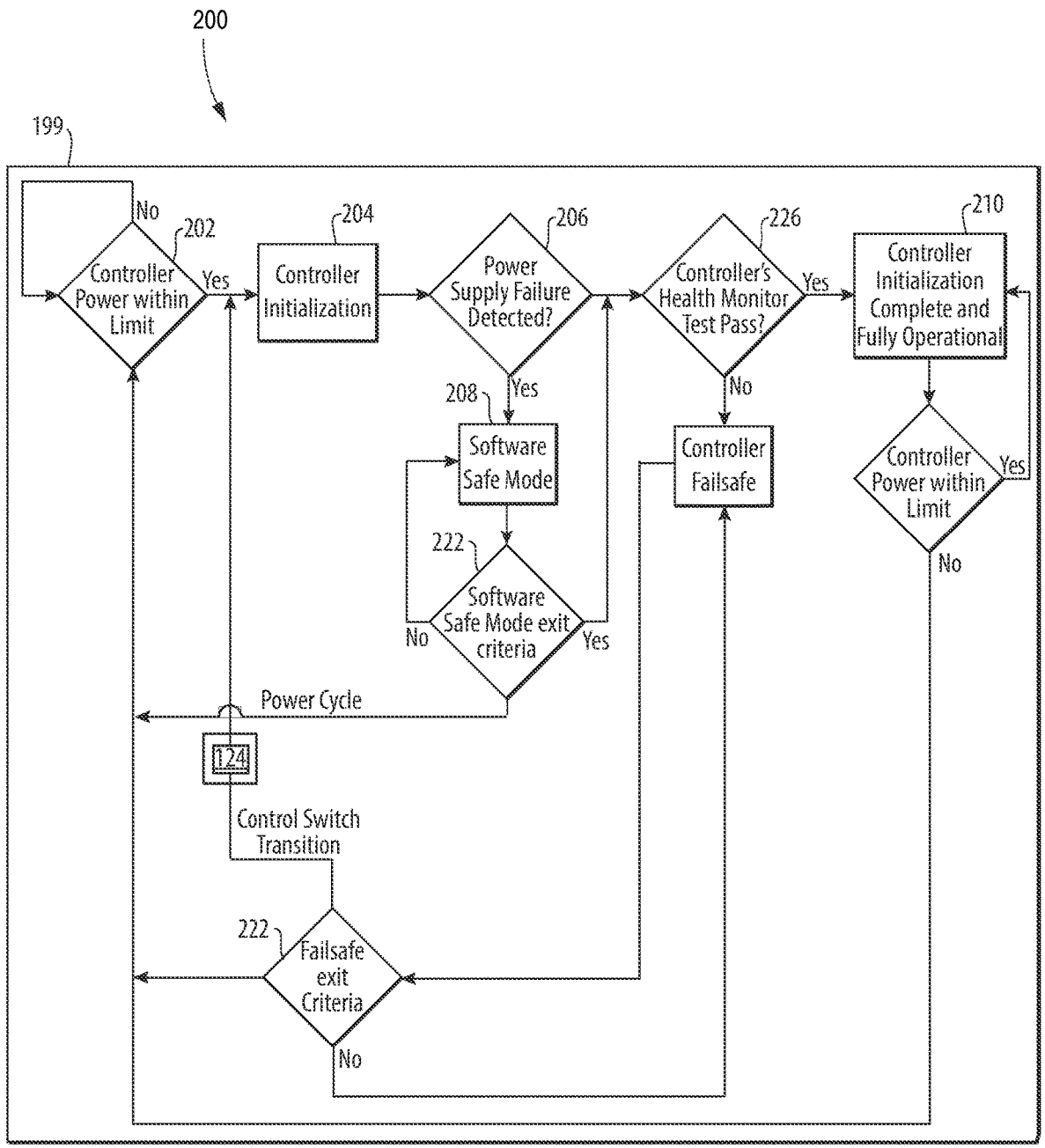
FIG. 2 is a flow chart of a method of operating the electrical system of FIG. 1.
Figure 3:
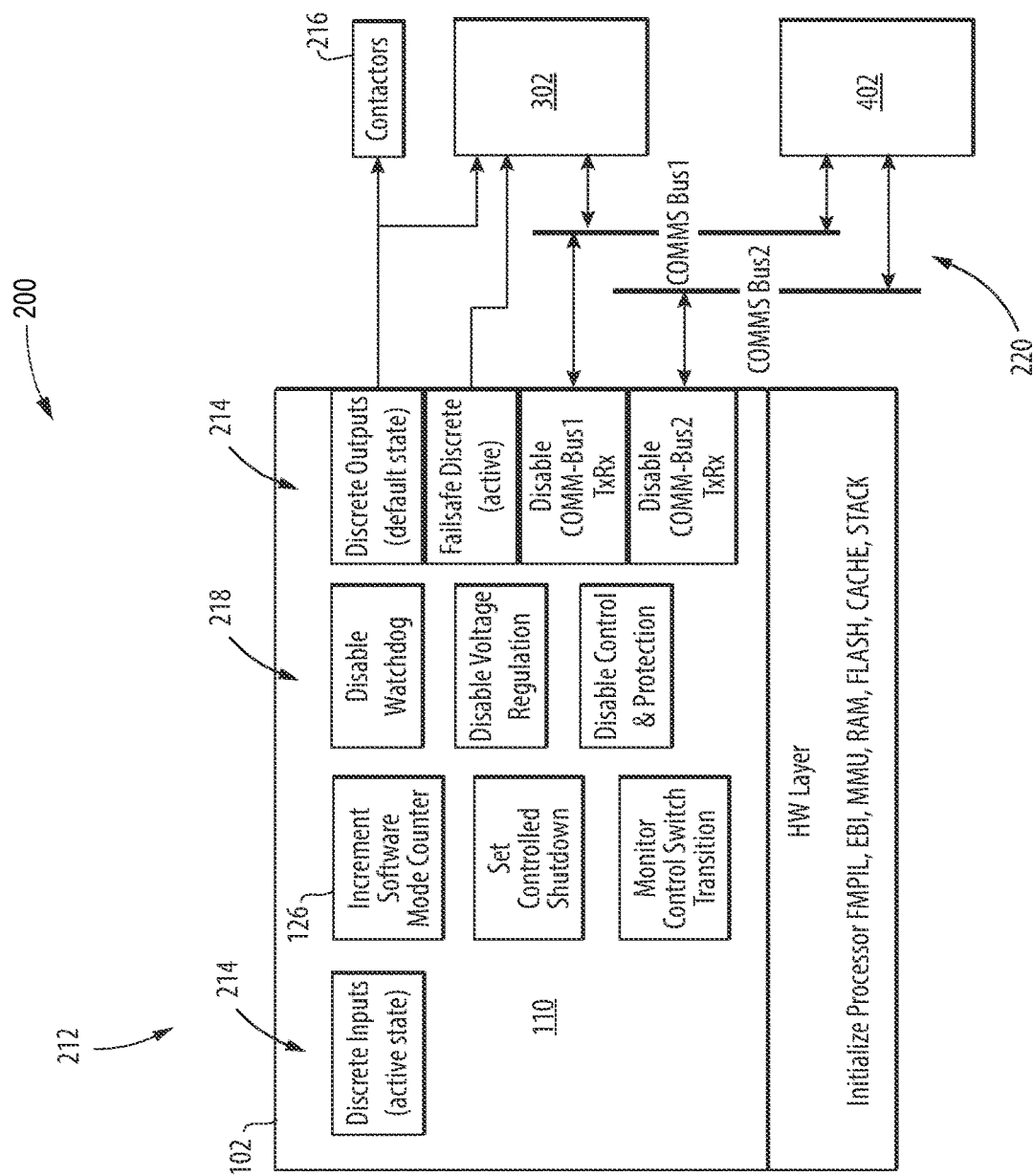
FIG. 3 is a schematic plan view of a controller of the electrical system of FIG. 1.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-3.

In accordance with at least one aspect of this disclosure, as shown in FIG. 1, an aircraft electrical system 100 (e.g. aircraft avionics) can include at least a power supply 104, a voltage regulator 106, a voltage monitor 108. In certain embodiments, the power supply 104 can be a low voltage power supply (e.g., supplying 3.3V, 5V, +15V and −15V to the controller 102 and other components within the controller 102 to utilize), the voltage regulator 106 can an under voltage inhibitor configured to inhibit power supply to the controller 102 in an under voltage state (e.g., when power supply to the controller 102 is below its limit), and the voltage monitor 108 can be configured to monitor voltage of the controller 102 and cease operation of the controller 102 in either an under voltage or over voltage state.

In certain embodiments, the controller 102 includes a software safe module 110. The software safe module can be configured to determine whether there was a sudden power failure upon controller 102 initialization, and cause operation of the controller 102 in a software safe mode if there was a sudden power failure. In that case, manual intervention can be required to leave (e.g. recover from) the software safe mode to prevent repetitive power failure of the controller 102. Any suitable manual intervention is contemplated herein. In certain embodiments, the software safe module 110 can be configured to detect power cycling events (e.g., when the aircraft electrical system 100 is in an air mode operation, e.g. while flying). In the air mode operation, in certain embodiments, the aircraft electrical system 100 is not expected to lose a respective 28 VDC control power, for example.

In certain embodiments, the controller 102 can include a data flag writing module 112 configured to write a normal operation data flag 114 that indicates normal operation to a memory 116 of the software safe module 110 in a normal operation mode (e.g., during air mode). For example, when the controller 102 enters into a full normal operational mode, the data flag writing module 112 can write into the memory 114 (e.g., Non-Volatile Memory (NVM)) to identify that controller 102 does not expect control power loss. In certain embodiments, the data flag writing module 112 can be configured to write the normal operation data flag 114 to the memory 116 when an aircraft engine 118 speed rises above a first threshold speed indicative of aircraft operation, or when any other normal mode indicator is present. The data flag 114 can be or include any suitable data configured to directly indicate or to inferentially indicate that the power to the controller 102 was lost (e.g., any data that is intended to be cleared during proper shutdown).

In certain embodiments, the controller 102 can include a data flag clearing module 120 configured to clear the normal operation data flag 114 during a normal shutdown, or any other normal shutdown indicator is present, and the controller 102 may not be otherwise configured to clear the normal operation data flag 114, such that the normal operation data flag 114 is indicative of a sudden power failure if it is present in the memory when the controller 102 is initialized. For example, to avoid the controller 102 from entering into the software safe mode on a default startup, the data flag 114 can be cleared as a result of a previous proper shutdown (e.g., automatically cleared when an aircraft engine 118 falls below a second threshold speed indicative of aircraft shutdown). If a sudden power failure had previously occurred instead of a proper shutdown, the data flag 114 can still be in the memory 116. In certain instances, the second threshold speed indicative of aircraft shutdown can be the same as first threshold speed indicative of aircraft operation, or the first and second thresholds can be different (e.g. to provide hysteresis).

In determining whether there was a sudden power failure, the software safe module 110 can thus be configured to check the memory 116 for the written normal operation data flag 114 which therefore can be indicative of a sudden power failure if in the memory 116 at initialization. Checking the memory 116 can occur upon initialization and before allowing the controller 102 to operate in the normal operational mode. If the data flag 114 indicative of a sudden power failure continues to be stored in the memory 116 at the subsequent initialization of the controller 102, the software safe module 110 can be configured to operate the controller 102 in the software safe mode on a subsequent initialization.

Referring additionally to FIGS. 2 and 3, in accordance with at least one aspect of this disclosure, a non-transitory computer readable medium 199 (e.g. as shown in FIG. 2) can include computer executable instructions can be configured to cause a computer to execute a computer implemented method 200 (e.g. as shown in FIGS. 2 and 3). In embodiments, the method 200 can include detecting 202 whether a controller power is within limits, initializing 204 a controller (e.g. controller 102) if the controller power is within limits, checking 206 for a data flag (e.g. data flag 114) indicative of a sudden power failure in a memory (e.g. memory 116), and booting 208 the controller 102 in a software safe mode to prevent repetitive power failure if a data flag 114 indicative of a sudden power failure is detected in the memory 116, wherein the software safe mode cannot be exited without manual intervention. In this way, it is possible to use the software safe mode to prevent the controller 102 from automatically resetting itself following a power failure.

In embodiments, the method 200 can further include booting 210 the controller 102 in a normal mode if the data flag 114 indicative of a sudden power failure is not detected, and writing a normal mode data flag 114 indicative of the normal mode to a memory 116 of the controller 102 when the controller 102 is booted in normal mode. In embodiments, the method 200 can further include clearing the data flag 114 from the memory 116 if a manual intervention signal is provided to the controller 102 to prevent the controller 102 from booting into software safe mode on the subsequent initialization.

In certain embodiments, booting 208 the controller into the software safe mode can include one or more of coordinating 212 the software safe mode of the controller 102 with one or more existing safe modes of the controller 102, placing 214 all discrete elements of the controller into a safe state, relinquishing 216 control of one or more dual controlled contactors of the controller, disabling 218 one or more voltage regulators, disabling 220 all controller communications outside of the electrical system 100 and/or maintaining an existing communication network within the controller 102.

In embodiments, coordinating 212 can include providing information to any downstream controllers and/or systems that the controller 102 has experienced a sudden power failure, and may not be functioning properly. For example, as shown in FIG. 3, controller 102 can be a generator control unit, for example communicating with downstream controllers 302, 402, which can be operating in their respective normal operation modes. In this example, controller 302 can be another generator control unit and controller 302 can send the information regarding the dysfunctions of controller 102 to the controller 402, which may be a flight computer or avionics, for example. As shown, embodiments can include multiple different communication networks, for example, and operating the controller in the software safe mode manages these networks disabling those networks that are not needed, but while maintaining networks between controllers such that information regarding a failed controller can be passed downstream. In embodiments, placing 214 can include setting all or most of the discrete outputs to a default state, where the switches are set to default, where they do not cycle.

In certain embodiments, the method 200 can further include monitoring 222 a control switch transition block 124 for exit criteria to exit the software safe mode, for example manual intervention. In embodiments, manual intervention can include activating the control switch transition block 124, for example activating the recovery switch by a user (e.g. a pilot). In certain embodiments, the operation of the control switch transition block 124 and pilot intervention can mimic existing hardware safe mode behavior and recovery for other electrical systems to avoid pilot workload and maintenance confusion, for example. In certain embodiments, the software safe mode can be recoverable with any source switch transition. This differs from typical failsafe recovery in which an ON OFF transition may be used. Using any source switch transition as used in the system 100 and method 200 offers the ability to support other types of failsafe events (e.g. single event upset/failure) and subsequent recovery after the software safe mode is established. Additionally allowing recovery from the software safe mode in this manner can provide additional support of ground mode maintenance if a controller 102 has failed.

In certain embodiments, the method can include performing 226 a health test of the controller 102 if a data flag 114 indicative of a sudden power failure is not detected, prior to booting in normal mode, and booting 210 the controller 102 into a normal mode if the controller 102 passes the health test. The health test can be a self-health test, or the health test can be commissioned as part of an electrical system level health monitoring test.

In certain embodiments, the software safe module 110 can include logic configured to operate as follows. Prior to entering the software safe mode and before full operation mode, the controller 102 can be initialized for all the desired initial inputs, outputs, peripherals of the control system processors. These inputs and outputs of the controller 102 can be used to evaluate the criteria for entering or bypassing the software safe mode. More specifically, the controller 102 can initialize the following e.g. microprocessor and/or its peripherals, Timers, Data/Address Bus, CPU register, A/D converters, watchdog circuit, processor clock, Internal RAM, external RAM, memory management unit (MMU), Cache, Stack, Watchdog and application specific (e.g. general-purpose input/output (GPIO), non-volatile memory (NVM), Interrupts.

Upon initialization, a "Normal Operation" parameter can be set to "true" in the memory 116 when the system transitions to air mode and the engine spinning faster than a minimum air mode idle speed with generators sourcing electrical power (e.g., upon normal mode operation of the controller). In this case, the data flag 114 can be written to the memory 116. Otherwise, the "Normal Operation" parameter can be set to "false" in the memory 116 when the system transitions to a mode other than air mode or both the engine spinning slower than minimum air mode idle speed. Here, no data flag 114 may be written to the memory 116.

Subsequently, if the controller 102 initializes (e.g. the power supply to the controller turns ON) and the last state of the "Normal Operation" parameter in the memory 116 is "true", then the controller 102 can enter the software safe mode. If, however, when the controller 102 initializes (e.g. the power supply to the controller turns ON), and the last state of the "Normal Operation" parameter in the memory 116 is "false", then the controller 102 can bypass the software safe mode and proceed to a health test (if desired) and then boot into to full normal operation mode.

When the controller 102 enters the software safe mode, a memory data flag counter 126 (e.g., as shown in FIG. 3) can be incremented and recorded internally for maintenance and engineering reference. For example, to support future event investigations by maintenance and engineering technicians, a maintenance record can be stored in the memory 116 when the controller 102 transitions from software safe mode into normal operation mode. The maintenance record can include the number of data flags 114 counted in the memory 116 over a given period of time, which can then be provided to the aircraft for onboard maintenance support. However it is contemplated that the a memory data flag counter 126 can be separate from the data flag 114 written to the memory indicative of a power failure, such that when the software safe module 110 checks the memory 116 for existence of a data flag 114, it does not check the data flag counter 126.

In a typical aircraft electrical system, when power is supplied to the controller, the controller can initialize and finalize all the necessary inputs, outputs, peripherals of the controller. Once complete, a health monitor test of the controller can be performed to determine if any failures are observed in the critical circuits of the controller. In such systems, if the controller passes the health monitor test, the remaining initialization of the controller can be performed so that the controller can enter into a fully operational mode. During full operational mode, any intermittent input power and/or internal power supply related failures of the critical circuits may result in unpredictable system behavior. In such systems, this occurs repetitively, the effects may be negatively felt on downstream system components.

For example, the controller can operate contactors that open and close when power supply is turned on and off, which can cause the controller to fully power off if the power supply to the controller is outside its limits, and then power on once the power supply returns to within its limits, causing power cycle. In certain instances, the controller can experience repetitive power cycling and recovering automatically multiple times in the same flight. Embodiments can counter the respective power cycling experienced by the controller to mitigate the unpredictable system behavior and downstream effect.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A controller for an aircraft electrical system, comprising:
    a software safe module configured to:
        determine whether there was a sudden power failure upon controller initialization; and
        cause operation of the controller in a software safe mode if there was a sudden power failure such that manual intervention is required to leave the software safe mode to prevent repetitive power failure of the controller.

2. The controller of claim 1, further comprising a data flag writing module configured to write a normal operation data flag that indicates normal operation to a memory of the software safe module in a normal operation mode.

3. The controller of claim 2, further comprising a data flag clearing module configured to clear the normal operation data flag during a normal shutdown and wherein the controller is not otherwise configured to clear the normal operation data flag such that the normal operation data flag is indicative of a sudden power failure if it is present at controller initialization.

4. The controller of claim 3, wherein, in determining whether there was a sudden power failure, the software safe module is configured to check the memory for the normal operation data flag indicative of a sudden power failure upon initialization and before allowing operating the controller in the normal operational mode.

5. The controller of claim 3, wherein the software safe module is configured to operate the controller in the software safe mode on a subsequent initialization if the data flag indicative of a sudden power failure continues to be stored in the memory at the subsequent initialization of the controller.

6. The controller of claim 3, wherein the data flag writing module is configured to write the normal operation data flag to the memory when an aircraft engine speed rises above a first threshold speed indicative of aircraft operation or other normal mode indicator is present.

7. The controller of claim 6, wherein the data flag clearing module is configured to clear the normal operation data flag when the aircraft engine falls below a second threshold speed indicative of aircraft shutdown or other normal shutdown indicator is present.

8. A computer implemented method comprising:
    detecting whether a controller power is within limits;
    initializing a controller if the controller power is within limits;
    checking for a data flag indicative of a sudden power failure in a memory; and
    booting the controller in a software safe mode to prevent repetitive power failure if a data flag indicative of a sudden power failure is detected in the memory, wherein the software safe mode cannot be exited without manual intervention.

9. The method of claim 8, further comprising:
    booting the controller in a normal mode if the data flag indicative of a sudden power failure is not detected; and
    writing a normal mode data flag indicative of the normal mode to a memory of the controller when the controller is booted in normal mode.

10. The method of claim 9, wherein the normal mode data flag indicative of normal operation mode is the data flag indicative of a sudden power failure if it is stored the memory at a subsequent initializing of the controller.

11. The method of claim 10, further comprising, clearing the data flag from the memory if a manual intervention signal is provided to the controller to prevent the controller from booting into software safe mode on the subsequent initialization.

12. The method of claim 8, wherein booting the controller into the software safe mode further includes one or more of:
    coordinating the software safe mode of the controller with one or more existing safe modes of the controller;
    placing all discrete elements of the controller into a safe state;
    relinquishing control of one or more dual controlled contactors of the controller;

disabling one or more voltage regulators;
disabling all controller communications outside of the electrical system; and/or
maintaining an existing communication network within the controller.

13. The method of claim 8, further comprising, monitoring a control switch transition block for manual intervention, wherein manual intervention includes activating the control switch transition block.

14. The method of claim 13, wherein the manual intervention includes a pilot activating the control switch transition block.

15. The method of claim 8, further comprising,
performing a health test of the controller if a data flag indicative of a sudden power failure is not detected and prior to booting in normal mode; and
booting the controller into a normal mode if the controller passes the health test.

16. A non-transitory computer readable medium comprising computer executable instructions configured to cause a computer to execute a method, the method comprising:
detecting whether a controller power is within limits;
initializing a controller if the controller power is within limits;
checking for a data flag indicative of a sudden power failure in a memory; and
booting the controller in a software safe mode to prevent repetitive power failure if a data flag indicative of a sudden power failure is detected in the memory, wherein the software safe mode cannot be exited without manual intervention.

17. The non-transitory computer readable medium of claim 16, further comprising,
booting the controller in a normal mode if the data flag indicative of a sudden power failure is not detected; and
writing a normal mode data flag indicative of the normal mode to a memory of the controller when the controller is booted in normal mode.

18. The non-transitory computer readable medium of claim 17, wherein the normal mode data flag is the data flag indicative of a sudden power failure if it is stored in the memory at a subsequent initializing of the controller.

19. The non-transitory computer readable medium of claim 16, wherein checking for the data flag includes checking the memory for the normal operation data flag indicative of a sudden power failure upon initialization and before allowing operating the controller in the normal operational mode.

20. The non-transitory computer readable medium of claim 16, further comprising clearing the data flag from the memory if a manual intervention signal is provided to the controller to prevent the controller from booting into software safe mode on the subsequent initialization.

* * * * *